United States Patent [19]

Greenway

[11] 4,121,180
[45] Oct. 17, 1978

[54] BROADBAND DIRECTIONAL COUPLER

[75] Inventor: Thomas H. Greenway, Londonderry, N.H.

[73] Assignee: Technical Research and Manufacturing, Inc., Manchester, N.H.

[21] Appl. No.: 753,987

[22] Filed: Dec. 27, 1976

[51] Int. Cl.² .......................... H01P 5/12; H01P 5/18; H01P 5/16
[52] U.S. Cl. ........................................... 333/10; 333/8; 333/11
[58] Field of Search ............................... 333/8, 10, 11

[56] References Cited

U.S. PATENT DOCUMENTS

| | | | |
|---|---|---|---|
| 2,734,169 | 2/1956 | Douma | 333/10 |
| 3,723,913 | 3/1973 | Seidel | 333/10 |

FOREIGN PATENT DOCUMENTS 315,888  10/1930  United Kingdom ...................... 333/10

Primary Examiner—Alfred E. Smith
Assistant Examiner—Harry E. Barlow
Attorney, Agent, or Firm—Robert T. Dunn

[57] ABSTRACT

A four port directional coupler using two substantially identical transformers, each transformer having a turn ratio N with a substantially pure resistive impedance across both of the transformer's secondary windings and a substantially pure resistive impedance connecting the transformer's primary windings, whereby the coupling coefficient, C, of the directional coupler is a function of the said resistive impedances and N and is substantially a continuous function of the values of said resistive impedances for any independently selected value of N.

10 Claims, 13 Drawing Figures

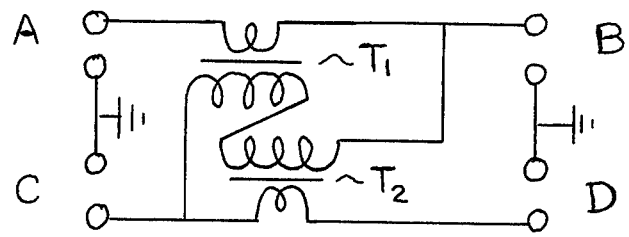
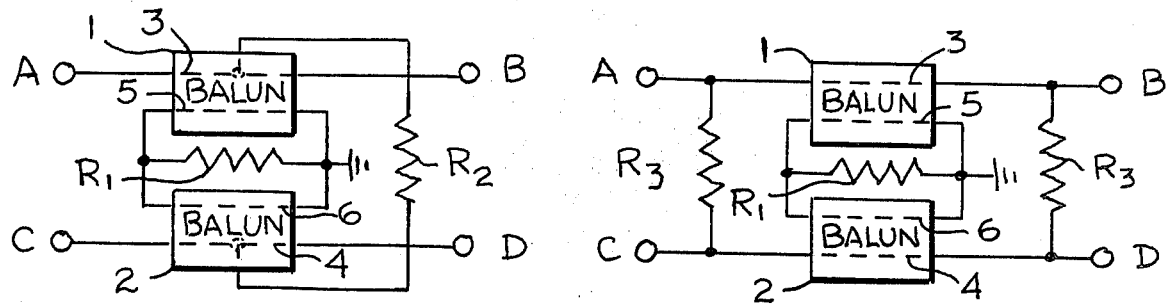
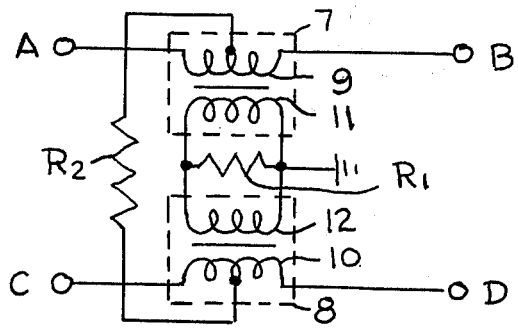
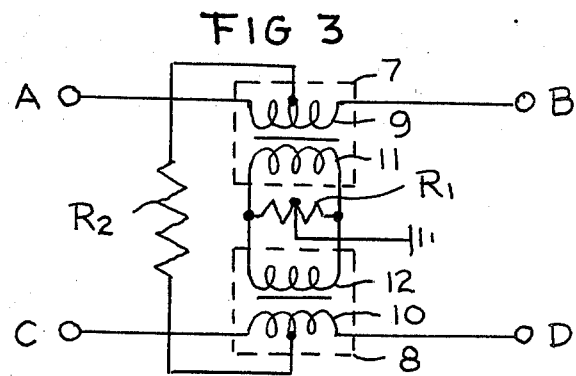
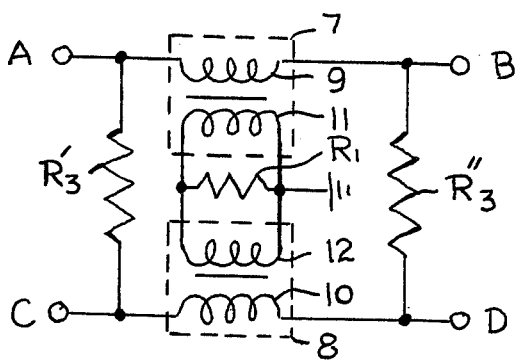
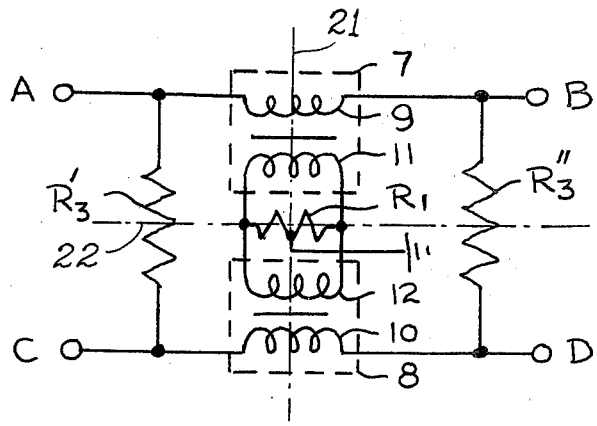

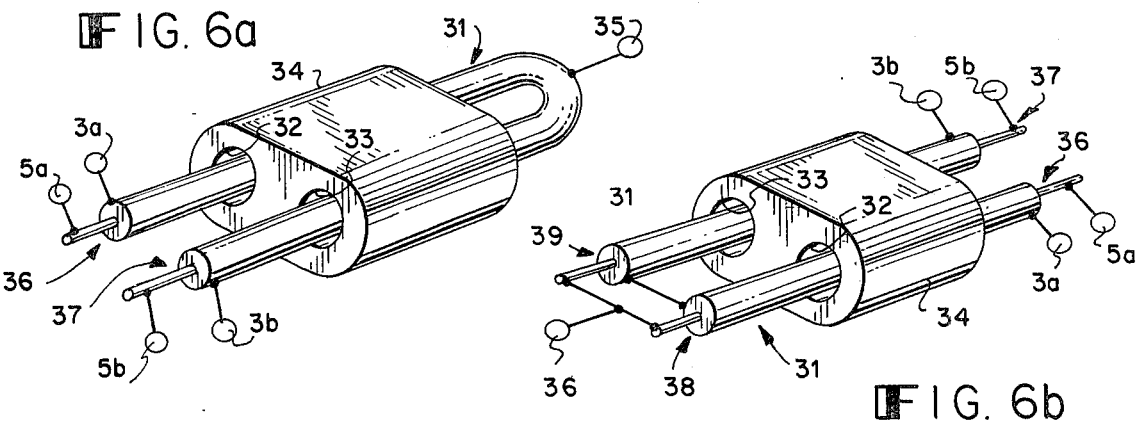
FIG. 6a
FIG. 6b
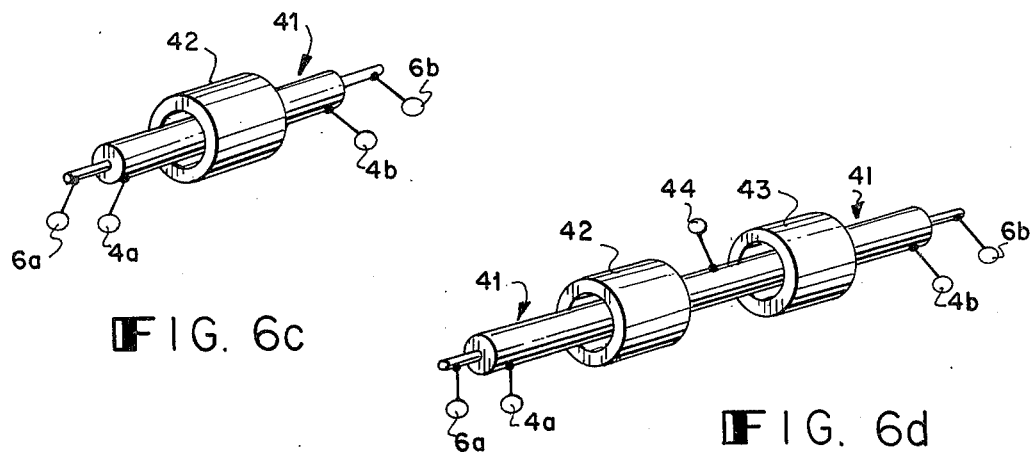
FIG. 6c
FIG. 6d
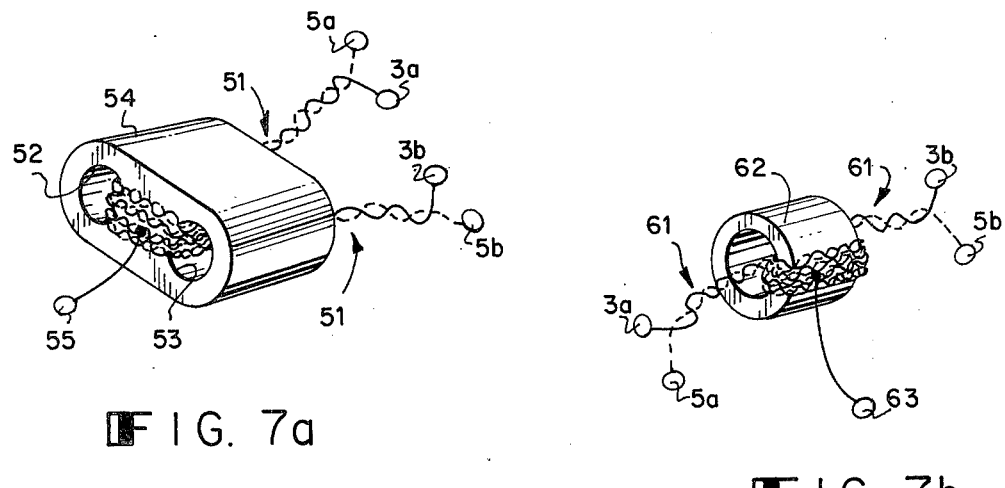
FIG. 7a
FIG. 7b 4,121,180

BROADBAND DIRECTIONAL COUPLER

BACKGROUND OF THE INVENTION

The present invention relates to directional couplers and more particularly to four port directional couplers using a pair of transformers or baluns.

Heretofore, relatively broadband, hybrid four port directional couplers have been provided using two identical transformers as shown in FIG. 1. The four ports, designated A, B, C & D are provided by two identical transformers $T_1$ and $T_2$ connected substantially as shown in FIG. 1. In this directional coupler, the coupling between an input and a coupled output is determined solely by the turns ratio, N, of the transformers. For high values of coupling coefficient, C, (C greater than 10db) the turns ratio, N, must be a rational number, some coupling values cannot, in principal, be achieved. For example, a value of coupling $C = \sqrt{13}$ can only be approximated and for many coupling values the approximation cannot be realized without an excessive number of turns in the transformers.

Some effort has partially overcome the limitations of the hybrid four port directional coupler by using specially designed reactive circuits coupling the four ports. However, these efforts have resulted in directional couplers with multipolar response characteristics of limited bandwidth. In addition, they do not possess a symmetry with respect to all ports and they are limited to quadrature couplers.

Accordingly, it is an object of the present invention to provide a relatively broadband non-quadrature directional coupler which is substantially free of the above-mentioned limitations of prior directional couplers.

It is a more specific object of the present invention to provide a relatively broadband four port directional coupler for which the coupling factor between ports is not limited by the turns ratio of transformers in the coupler.

It is a further object to provide such a directional coupler which accomplishes the above objects and, in addition, is physically symmetrical.

SUMMARY OF THE INVENTION

In accordance with the present invention, a four port directional coupler providing ports or terminals A, B, C & D includes two identical transformers, each having a primary circuit and a secondary circuit. One of the circuits of one transformer provides terminals A and B and one of the circuits of the other transformer provides terminals C and D. The other circuits of the two transformers are connected to each other electrically in parallel and purely resistive impedances are coupled between said circuits so that the coupling factor between terminals is a function of those resistive impedances as well as the transformation ratio of the transformers. A particular advantage of this directional coupler is that the coupling coefficient, C, of the coupler is not limited by the transformation ratio of the transformers.

Particular embodiments of the present invention use a pair of substantially identical wire wound transformers. In other embodiments, two conductor transmission line baluns are used in place of the wire wound transformers. In all embodiments, four ports or terminals are provided any one of which may be an input port and for each input port there is an output port, a coupled port and an isolated port. Also, in all embodiments, coupling between the input port and the coupled port is not limited to the particular turns ratio, N, of the transformers, because it is a function of that ratio as well as the values of the resistive impedances connected between the transformers.

These and other objects, features and advantages of the present invention will appear more fully from the following description of the embodiments taken in conjunction with the drawings:

FIG. 1 is an electrical diagram illustrating one of the above mentioned prior art structures;

FIGS. 2 & 3 illustrate two embodiments of the present invention using a pair of transmission line baluns; and FIGS. 4a & 4b illustrate similar embodiments of the present invention using wire wound transformers;

FIGS. 5a & 5b illustrate other similar embodiments of the present invention using wire wound transformers.

FIGS. 6a, b, c, and d illustrate various forms of transmission line baluns using coaxil transmission lines; and FIGS. 7a and b illustrate transmission line using twisted-pair wire transmission lines.

DETAILED DESCRIPTION OF EMBODIMENTS OF THE INVENTION

Referring first to FIG. 1 which is marked prior art there is shown a transformer coupled circuit that functions as a hybrid, four port directional coupler. As already mentioned, coupling between an input terminal or port (such as A) and the coupled terminal is determined solely by the turns ratio, N, of the two transformers $T_1$ and $T_2$. The turns ratio, N, must be a rational number, because it is a quotient of two whole numbers and, hence, some coupling coefficient values for the coupler cannot be achieved except by approximation using many turns in the transformers. For this reason the coupling coefficient of this type of coupler is referred to as "granular." In other words, over a range of coupling coefficients, there are values that cannot be achieved. The various embodiments of the present invention illustrated by FIGS. 2 and 5 are not limited in this respect and so the coupling coefficient of the directional couplers of the present invention can be described as "non-granular." Furthermore, because of the electrical symmetry of embodiments, the couplers are referred to as bi-symmetric.

Two embodiments of the present invention using generic-type transmission line balun circuits are illustrated by FIGS. 2 and 3. In each of these, the balun circuit is a two conductor balun. Where transmission line balun circuits are used, one of the conductors is a primary and the other is a secondary circuit and where wire wound transformers are used, one of the conductors is the primary coil and the other is the secondary coil.

In FIG. 2, the two transmission line balun circuits provide the ports or terminals, denoted A, B, C & D. Terminals A and B are at opposite ends of a conductor 3 of balun 1 and terminals C and D are at opposite ends of conductor 4 of balun 2. The other conductors of the two baluns, conductor 5 of balun 1 and conductor 6 of balun 2 are connected in parallel. Pure resistive elements $R_1$ and $R_2$ connect the conductors of balun 1 with the conductors of balun 2. Resistor $R_1$ is in parallel with the conductors 5 and 6 of baluns 1 and 2, respectively. Resistor $R_2$ connects the electrical center of conductor 3 to the electrical center of conductor 4. Assuming for the moment that baluns 1 and 2 are identical and both have a coupling ratio from conductor to conductor of 1:1, then the coupling coefficient, C, of the directional coupling action between an input and coupled terminal is determined by the values of $R_1$ and $R_2$ only.

The electrical behavior of this circuit is independent of the choice of input terminals from among the terminals A, B, C or D. Any of these terminals can be the input terminal and the other terminal on the same balun conductor becomes the output terminal. Of the two other terminals, one is the coupled terminal and the other is the isolated terminal. The voltage coupling coefficient, C, coupler refers to the coupling between the input terminal and the coupled terminal. As another example, if D is the input terminal, then C is the output terminal, B is the coupled terminal and A is the isolated terminal. Hence, A and D are always isolated from each other and correspondingly, B and C are always isolated from each other.

The circuit shown in FIG. 3 is an electrical equivalent of the circuit in FIG. 2. Here, the connecting resistor $R_2$ between Balun conductors 3 and 4 is replaced by two resistors, both designated $R_3$. $R_3'$ connects terminals A and C and $R_3''$ connects terminals B and D. $R_3$ is approximately twice $R_2$. This circuit, as the circuit in FIG. 2, is referred to as a non-granular directional coupler. Where the baluns in either of these circuits are 1:1, the directional coupling coefficient, C, is determined by the value of the resistances; more particularly, the value of resistances $R_1$ and $R_2$ in FIG. 2 and the value of the resistances $R_1$, $R_3'$ and $R_3''$ in FIG. 3.

Embodiments of the invention similar to embodiments shown in FIGS. 2 and 3, but using instead of transmission line baluns, wire-wound transformers are illustrated by FIGS. 4a, 4b, 5a and 5b. In all these, the transformers 7 and 8 are preferably identical, each including a primary coil and a secondary coil coupled inductively. The coil turns ratio for these transformer is N. In transformer 7, the primary coil 9 connects at opposite ends to terminals A and B and in transformer 8 the primary coil 10 connects at opposite ends to terminals C and D. The secondary coil 11 of the transformer 7 and the secondary coil 12 of the transformer 8 are connected in parallel across resistor $R_1$.

In FIGS. 4a and 4b, the primary coils 9 and 10 include center taps that connect by resistor $R_2$. In FIGS. 5a and 5b, resistance $R_2$ is replaced by resistances $R_3'$ and $R_3''$ which are equal to each other and substantially equal to twice $R_2$.

The embodiments shown by FIGS. 4b and 5b are, clearly, physically symmetrical about two perpendicular planes. One of these planes, 21, called the left-right plane, is perpendicular to the drawing and through the centers of the transformers, perpendicular to the transformer coils. The other plane, 22, referred to as the horizontal plane, is also perpendicular to the drawing and through the resistor $R_1$ between the transformers.

The electrical symmetry of the circuit in FIG. 4b is not disturbed by the location of the ground connection of the secondary circuits. Evidence of this is that transmission line baluns can be used in place of the wire wound transformers (FIG. 2).

FIGS. 5a and 5b are similar to FIG. 3 but use conventional wire wound transformers instead of transmission line baluns. FIG. 5b is clearly electrically symmetrical with regard to both the left-right and the horizontal planes, 21 and 22.

In all embodiments using coil transformers where N = 1, the directional coupler coupling coefficient, C, is determined by the resistances only as follows:

$$R_1 = (2C/2 - C) Ro$$

$$R_2 = Ro^2/R_1$$

where $Ro$ is the characteristic impedance of the coupler and, as before, C is the voltage coupling coefficient.

The coupling coefficient for the directional coupler from, the input terminal to the coupled terminal is a function of N and R. This is the case for any of the embodiments shown in FIGS. 2 through 5. For the embodiments using coil transformers, if coupling coefficient desired does not lead to a convenient value of $R_1$, then N can be changed and $R_1$ changed by a factor $N^2$ without changing the coupling coefficient.

Several transmission line balun circuits of various forms using coaxial transmission lines are illustrated by FIGS. 6a, b, c, and d. Each of these couples high frequency wave fields through a ferrite body and each provides for terminals like the four terminals of the baluns 1 or 2 in FIG. 3. In addition, FIGS. 6a, b, and d provide a center tap like the baluns in FIG. 2. Turning first to FIG. 6a there is shown a coaxial transmission line 31 looped through two openings 32 and 33 of a ferrite balun core 34. The four terminals of this transmission line balun at the two ends of the line on one side of the ferrite body and are denoted 3a, 3b, 5a and 5b. Terminals 3a and 3b are the outer conductor of the coaxial line 31 and 5a and 5b are the center conductor at ends 36 and 37, respectively. This balun circuit is suitable for use in FIG. 3. A center tap 35 can be provided at the loop on the opposite side of the ferrite from the four terminals connected to the outer conductor as shown in FIG. 6a. With such a center tap, this balun is suitable for use in FIG. 2.

FIG. 6b shows a very similar structure to the structure of 6a, however, the center tap is taken a different way; tap 36 is taken from the center conductor of the coaxial line on the opposite side of the ferrite core from the four terminals. Instead of a loop on that side, the coaxial line has two ends 38 and 39 connected as shown, center conductors connected and outer conductors connected.

FIGS. 6c and 6d show ferrite bead or toroidal core type transmission line balun structures. In FIG. 6c the coaxial transmission line 41 passes through a single ferrite bead core 42. The center conductor of the transmission line on opposite sides of the core provide the terminals 6a and 6b and the outer conductor on opposite sides provides terminals 4a and 4b. A variation of this structure illustrated by FIG. 6d employs two cores and provides a center tap. Here, the coaxial transmission line 41 passes through two ferrite bead cores 42 and 43 and on opposite sides are the terminals 6a and 6b and 4a and 4b, provided just as in FIG. 6c. In addition, a center tap 44 is provided between the cores connected to the outer conductor of the coaxial line as shown. The transmission line ferrite balun circuits shown in FIGS. 6c and d are suitable for use in FIGS. 3 and 2, respectively.

Ferrite balun circuits using twisted-pair wire transmission lines instead of coaxial transmission lines are illustrated by FIGS. 7a and 7b. These balun structures are also suitable for use in FIGS. 2 and 3, as each has four terminals and can provide a center tap. Turning first to FIG. 7a, there is provided a ferrite core 54 having two passages 52 and 53 through the core, just as in FIG. 6a also. Wound around the section of the core between the two passages is a twisted-pair wire transmission line 51. One of the wires of this transmission line is shown as a broken line to distinguish it from the other which is shown as a solid line. One end of the transmission line emerging from the hole 52 provides terminals 3a and 5a and the other end emerging from hole 53 provides terminals 3b and 5b. A center tap, if desired, can be provided at 55 connected to one of the two wires of the twisted pair at the middle turn around the core.

Another twisted-pair wire transmission line ferrite balun is illustrated by FIG. 7b. Here, the transmission line 61 is wound around a simple ferrite toroidal bead core 62. Again, one end of the transmission line provides terminals 3a and 5a and the other provides terminals 3b and 5b while a center tap may be taken at 63 connected to one of the two wires of the twisted-pair at the middle turn around the core.

The above described ferrite core type transmission line balun circuits are but a few examples of a great many transmission line balun circuits that could be used in the broad band coupler circuits shown in FIGS. 2 or 3. Generally, a transmission line balun circuit of the type referred to in these embodiments is a balanced to unbalanced transformer in which the conductors are elements of a transmission line. In other words, the conductors in a transmission line balun circuit are the conductors of a transmission line.

The embodiments of the present invention described herein represent the best known uses of the invention and are considered the preferred embodiments. However, it should be clearly understood that modification of these will occur to those skilled in the art. For example, other types of transmission line balun or transformer circuits could be used and the coupling between primary and secondary elements of these could be made through one or more resistive elements of networks of resistive elements without deviating from the spirit and scope of the invention as set forth in the appended claims.

What is claimed is:

1. A directional coupler having four terminals A, B, C and D comprising,
    (a) a first transformer having a primary circuit and a secondary circuit referred to herein as the first primary and first secondary circuits, respectively,
    (b) a second transformer having a primary circuit and a secondary circuit referred to herein as the second primary and second secondary circuits, respectively,
    (c) said first primary circuit providing terminals A and B, and
    (d) said second primary circuit providing terminals C and D,
    (e) secondary circuit resistive impedance means connected in parallel with said first and second secondary circuits,
    (f) primary circuit resistive impedance means connecting said first and second primary circuits, and
    (g) whereby a frequency input signal at A appears at B and C in substantially the same phase and is substantially isolated from D.

2. A directional coupler as in claim 1 wherein,
    (a) the first and second transformers are substantially identical.

3. A directional coupler as in claim 2 wherein,
    (a) said primary circuit resistive impedance means is $R_2$ and is connected between points in the first primary and second primary circuits both in one of said planes of symmetry, and
    (b) said secondary circuit resistive impedance means is $R_1$ and is connected in parallel to each of said secondary circuits.

4. A directional coupler as in claim 2 wherein,
    (a) said primary circuit resistive impedance means includes a resistance $R_3'$ connecting corresponding points of terminals A and C and an equal resistance $R_3''$ connecting corresponding points of terminals B and D, and
    (b) said secondary circuit resistive impedance means is $R_1$ and is connected in parallel to both the first and second secondary circuits.

5. A directional coupler as in claim 2 wherein,
    (a) any one of said terminals is terminated with a load impedance to provide a three terminal directional coupler.

6. A directional coupler as in claim 2 for which the electrical circuit is physically symmetrical with respect to each of two perpendicular planes.

7. A directional coupler as in claim 2 wherein,
    (a) all electrical coupling between said primary circuits is through said secondary circuits and said primary circuit resistive impedance means.

8. A directional coupler as in claim 3 wherein,
    (a) said primary circuit resistive impedance means is $R_2$ and is connected between points in the first primary and second primary circuits both in one of said planes of symmetry, and
    (b) said secondary circuit resistive impedance means is $R_1$ and is connected in parallel to each of said secondary circuits.

9. A directional coupler as in claim 3 wherein,
    (a) said primary circuit resistive impedance means includes a resistance $R_3'$ connecting corresponding points of terminals A and C and an equal resistance $R_3''$ connecting corresponding points of terminals B and D, and
    (b) said secondary circuit resistive impedance means is $R_1$ and is connected in parallel to both the first and second secondary circuits.

10. A directional coupler as in claim 7 wherein,
    (a) the coupling coefficient, C, of said directional coupler is a function of the said primary and secondary circuit resistive impedance means and the transformation ratio of said transformers.

* * * * *

UNITED STATES PATENT OFFICE
CERTIFICATE OF CORRECTION

Patent No. 4,121,180            Dated October 17, 1978

Inventor(s) Thomas H. Greenway

It is certified that error appears in the above-identified patent and that said Letters Patent are hereby corrected as shown below:

Column 2, line 20, after "line" insert -- baluns --

Column 3, line 62, after "of" insert -- the --

Column 5, line 55, after "circuits" insert -- and --

Column 5, line 57, delete the second occurrence of "and"

Column 6, line 35, delete "3" and insert -- 6 --

Column 6, line 44, delete "3" and insert -- 6 --

Signed and Sealed this

Twentieth Day of March 1979

[SEAL]

Attest:

RUTH C. MASON
Attesting Officer

DONALD W. BANNER
Commissioner of Patents and Trademarks